United States Patent
Kinyua

(10) Patent No.: US 10,256,834 B1
(45) Date of Patent: Apr. 9, 2019

(54) ANALOG TO DIGITAL CONVERTER

(71) Applicant: Taiwan Semiconductor Manufacturing Company, Ltd., Hsinchu (TW)

(72) Inventor: Martin Kinyua, Cedar Park, TX (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/720,613

(22) Filed: Sep. 29, 2017

(51) Int. Cl.
 *H03M 1/12* (2006.01)
 *H03M 1/34* (2006.01)
 *H03M 1/14* (2006.01)

(52) U.S. Cl.
 CPC ........... *H03M 1/345* (2013.01); *H03M 1/145* (2013.01)

(58) Field of Classification Search
 CPC .......... H03M 1/164; H03M 1/44; H03M 1/12; H03M 1/0695
 USPC ................................. 341/155, 156, 161, 162
 See application file for complete search history.

(56) References Cited

U.S. PATENT DOCUMENTS

| | | | | |
|---|---|---|---|---|
| 6,340,944 B1 * | 1/2002 | Chang | ................... | H03M 1/002 341/161 |
| 6,369,744 B1 * | 4/2002 | Chuang | ............... | H03M 1/0695 341/120 |
| 7,126,415 B2 | 10/2006 | Maloberti et al. | | |
| 8,754,794 B1 * | 6/2014 | Li | ........................ | H03M 1/1057 341/118 |
| 9,143,153 B1 | 9/2015 | Tai et al. | | |
| 2005/0062635 A1 * | 3/2005 | Franz | ................... | H03M 1/1235 341/161 |
| 2005/0078026 A1 * | 4/2005 | Cai | ........................ | H03M 1/164 341/162 |

(Continued)

FOREIGN PATENT DOCUMENTS

| KR | 10-2012-0029019 A | 3/2012 |
|---|---|---|
| KR | 10-2012-0064505 A | 6/2012 |

OTHER PUBLICATIONS

Korean Office Action for Application No. 10-2017-0163455 dated Dec. 13, 2018.

*Primary Examiner* — Linh V Nguyen
(74) *Attorney, Agent, or Firm* — Merchant & Gould P.C.

(57) ABSTRACT

An analog-to-digital converter ("ADC") has an input terminal configured to receive an analog input voltage signal. A first ADC stage is coupled to the input terminal and is configured to output a first digital value corresponding to the analog input voltage signal and an analog residue signal corresponding to a difference between the first digital value and the analog input signal. A second ADC stage is coupled to the first ADC stage and is configured to convert the analog residue signal to a second digital value. At least one of the first ADC stage and the second ADC stage includes a first sub-stage configured to convert an analog signal to a first number of bits of a digital value representing the analog signal, and a second sub-stage configured to convert the analog signal to a second number of bits of the digital value, where the second number of bits is greater than the first number of bits. A controller is coupled to the first and second ADC stages and configured to combine the first digital value and the second digital value into a digital output signal representing the analog input voltage signal.

18 Claims, 6 Drawing Sheets

(56) References Cited

U.S. PATENT DOCUMENTS

| | | | |
|---|---|---|---|
| 2007/0159374 A1* | 7/2007 | Chen | H03M 1/1225 341/161 |
| 2010/0085227 A1* | 4/2010 | Chang | H03M 1/1225 341/120 |
| 2010/0156692 A1* | 6/2010 | Jeon | H03M 1/164 341/162 |
| 2010/0182177 A1* | 7/2010 | Lin | H03M 1/1014 341/122 |
| 2010/0309034 A1* | 12/2010 | Ohyama | H03M 1/002 341/118 |
| 2012/0062400 A1 | 3/2012 | Jeon | |
| 2012/0086590 A1* | 4/2012 | Satarzadeh | H03M 3/38 341/120 |
| 2012/0146820 A1* | 6/2012 | Nam | H03M 1/069 341/110 |
| 2012/0146821 A1 | 6/2012 | Nam et al. | |
| 2013/0038478 A1* | 2/2013 | Souchkov | H03M 1/1057 341/122 |
| 2013/0038483 A1* | 2/2013 | Liu | H03M 1/147 341/161 |
| 2013/0187805 A1* | 7/2013 | Garrity | H03M 1/1215 341/155 |
| 2013/0234870 A1* | 9/2013 | Haque | H03M 1/0626 341/110 |
| 2013/0321184 A1* | 12/2013 | Lin | H03M 1/164 341/110 |
| 2014/0002291 A1* | 1/2014 | Atriss | H03M 1/187 341/172 |
| 2014/0062736 A1* | 3/2014 | Nandi | H03M 1/0675 341/110 |

\* cited by examiner

ANALOG TO DIGITAL CONVERTER

BACKGROUND

Analog-to-digital converters ("ADC") are used in a variety of applications in order to convert a detected analog signal into a digital signal. Typically, the digital output is a binary number that is proportional to the input. The continuous analog input signal is periodically sampled, and the output is a discrete digital signal. Converting a continuous analog signal to a digital signal requires quantization of the analog input, which can introduce error.

Factors measuring ADC performance include conversion bandwidth and dynamic range (signal-noise-ratio), among other things. The bandwidth of an ADC is characterized primarily by its sampling rate, and the dynamic range of an ADC is influenced by factors such as resolution (number of discrete values output over the range of the analog input values), linearity and accuracy (how well the quantization levels match the true analog signal), etc. The dynamic range of an ADC may be expressed in terms of its effective number of bits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
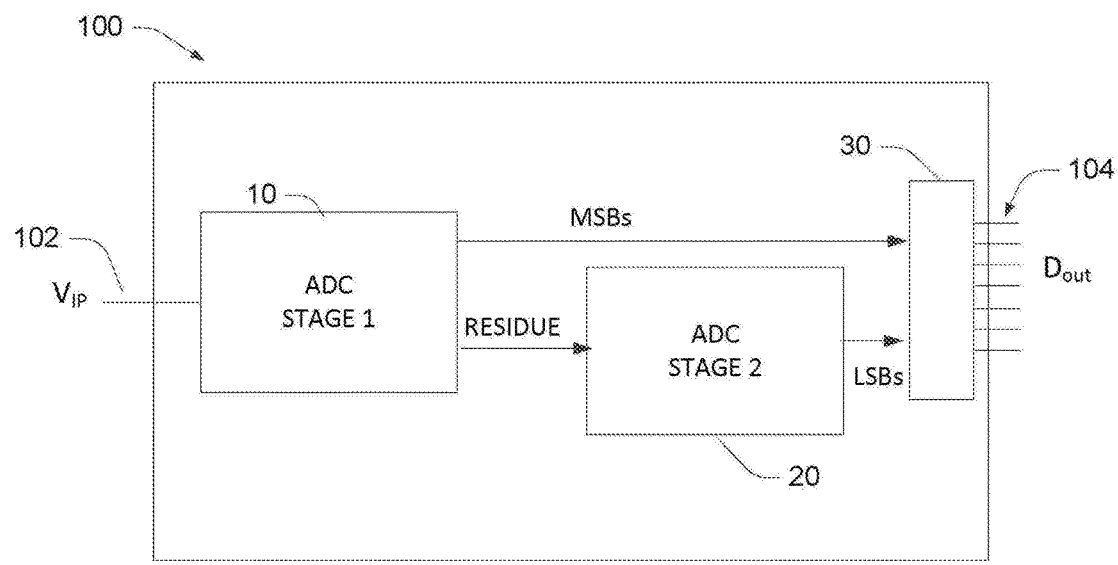
FIG. 1 is a block diagram illustrating aspects of an analog-to-digital converter ("ADC") system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters ("ADC") convert an analog signal into a digital signal. Typical ADC arrangements include pipelined, flash, Delta-Sigma, integrating (sloping), successive approximation register ("SAR"), etc. Pros and cons are associated with each ADC architecture. For instance, Delta-Sigma ADCs are capable of achieving relatively high resolution (16 bits and higher), but the achievable bandwidth may be limited.

SAR ADCs are typically able to operate with relatively low power consumption, but may have limited resolution. Increasing resolution and bandwidth with known SAR ADC arrangements can require undesirable increased power consumption.

FIG. 1 generally illustrates an example of an ADC system 100 in accordance with some disclosed embodiments. In general, the ADC system 100 includes a first subranging ADC stage 10 and a second subranging ADC stage 20. An input terminal 102 is configured to receive an analog input voltage signal $V_{IP}$, and the system 100 outputs a digital value $D_{out}$ representing the analog input signal $V_{IP}$ at an output terminal 104.

A first ADC stage 10 is coupled to the input terminal 104 and is configured to output a first digital value representing a portion of the digital output $D_{out}$, as well as an analog residue signal. A second ADC stage 20 is coupled to the first ADC stage 10 and converts the analog residue signal to a second digital value, which represents the remaining portion of the digital output $D_{out}$.

Figure 2:
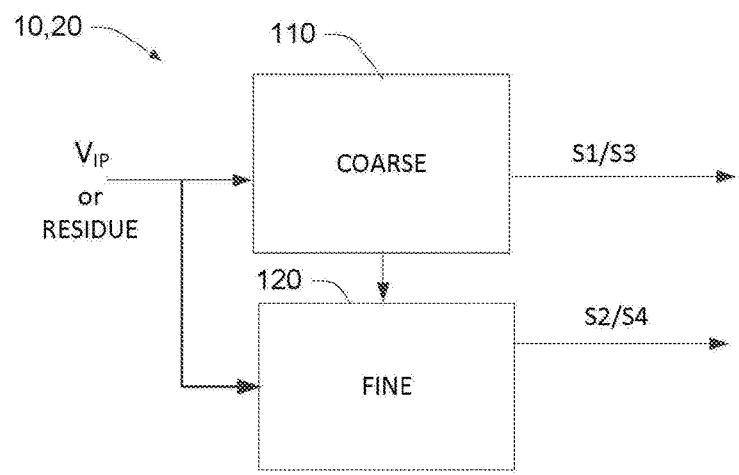
FIG. 2 is a block diagram illustrating further aspects of an example ADC system in accordance with some embodiments.

Referring to the example shown in FIG. 2, one or both of the first ADC stage 10 and/or the second ADC stage 20 include a first sub-stage, which in the illustrated example is a coarse stage 110, configured to convert an analog voltage signal to a first number of digital output bits S1, and a second sub-stage, which in the illustrated example is a fine stage 120, configured to convert the analog voltage signal to a second number of bits S2, where the second number of bits may be greater than the first number of bits.

Thus, for the first ADC stage 10, the coarse stage 110 receives the analog input voltage signal $V_{IP}$, and converts that analog signal to a digital value having S1 bits (the most significant bits (MSBs) of the first ADC stage 10). The bits S1 generated by the coarse stage 110 are also received by the fine stage 120, along with the analog input voltage signal $V_{IP}$. The fine stage 120 of the first ADC stage 10 then outputs S2 bits of the output (least significant bits (LSBs) of the first ADC stage 10 output). Additionally, the first ADC stage 10 outputs an analog residue signal, which is the difference between the generated digital value and the received analog signal.

Similarly, for the second ADC stage 20, the coarse stage 110 receives the analog residue signal, and converts that analog signal to a digital value having S3 bits (the MSBs of the second ADC stage 20 output). The bits S3 generated by the coarse stage 110 are also received by the fine stage 120, along with the residue signal. The fine stage 120 of the second ADC stage 10 then generates S4 bits of the output (LSBs of the second ADC stage 20 output), which are combined with the MSBs from the fine stage 110 to generate the digital output of the second ADC stage 20. The digital values generated by the first and second ADC stages 10, 20 are then combined by a controller 30, which provides the digital output signal $D_{out}$ at the output terminal 104.

In some embodiments, the first and/or second ADC stages 10, 20 employ successive approximation register (SAR) ADCs, where a voltage range that contains the input voltage is successively narrowed. At each successive step, a converter compares the input voltage to an output of an internal digital to analog converter (DAC). At each step in this process, this approximation is stored in a register. However, the conversion rate of known SAR ADC arrangements is limited by its serial ADC operation.

The disclosed arrangement provides an analog to digital conversion function at lower power compared to conventional pipelined SAR ADCs, by reducing the accuracy requirements of the fine stage 120 by employing the coarse stage 110, whose accuracy requirements can be significantly reduced. The accuracy requirements of the coarse stage 110 is reduced from S2+S1 bits to S1 bits (S2>S1) by the use of a scheme discussed further below.

In accordance with aspects disclosed herein, the fine stage 120 is used only for a portion of the first and/or second ADC 10, 20 conversion period, thus reducing the overall power consumption, while maintaining the benefits of high energy efficiency, high linearity and a fast SAR bit cycling loop.

Figure 3:
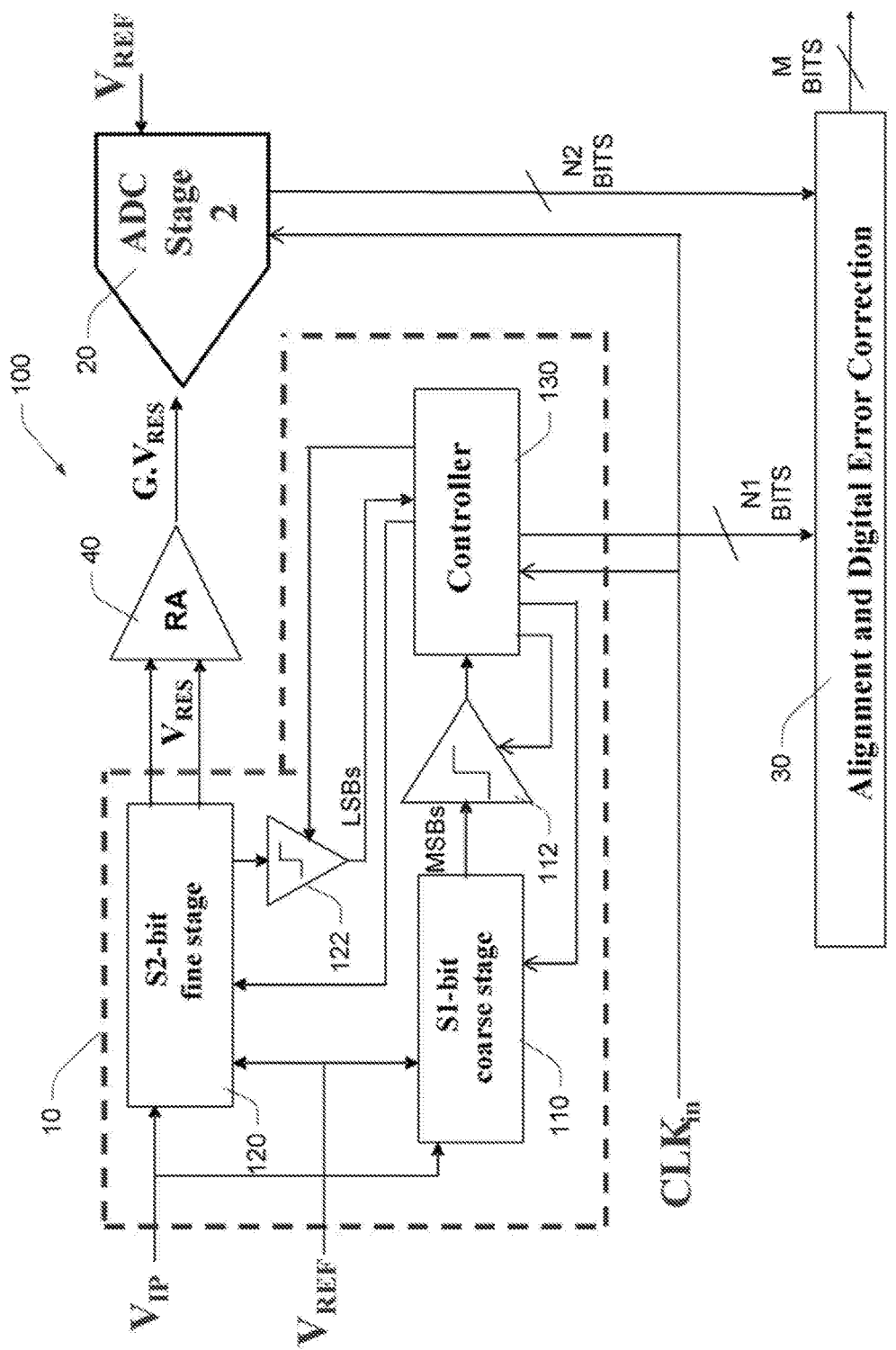
FIG. 3 is a circuit diagram illustrating further aspects of the ADC system illustrated in FIGS. 1 and 2.

FIG. 3 illustrates an example ADC system 100 employing a pipelined subranging SAR ADC, where at least the first stage ADC 10 is a first subranging SAR sub-ADC. The first ADC stage 10 outputs N1 bits of the total digital output M bits, as well as an analog residue signal $V_{RES}$. The residue signal, which represents the difference between the analog input voltage signal $V_{IP}$ and the digital value output by the first ADC stage 10, is output to a residue amplifier 40, which applies a gain factor to the residue signal $V_{RES}$. The amplified residue is received by the second ADC stage 20.

An asynchronous SAR digital controller 130 receives an external clock signal $CLK_{in}$, whose frequency is related to the overall conversion rate of the ADC system 100. The controller 130 is configured to asynchronously control operations of the first ADC stage 10 as shown in FIG. 3. The coarse and fine stages 110, 120 include respective fine and coarse comparators 112, 122. A reference voltage $V_{REF}$ defines the full scale analog signal range of the ADC system 100, which is successively narrowed by the coarse and fine stages 110, 120.

The coarse comparator 112 of the coarse stage 110 performs the MSB conversion of the first ADC stage. The resulting MSBs are received by the controller 30, which initiates the LSBs conversion by the fine comparator 122 of the fine stage 120. The resulting LSBs are then coupled to the controller 130, which combines the received MSBs and LSBs to output the N1 bits of the first stage to an alignment and digital error correction circuit implemented by the ADC controller 30.

The fine stage 120 of the first ADC stage 10 further generates the reside signal $V_{RES}$, which is the difference between the analog input signal $V_{IP}$ and the equivalent analog representation of the first ADC stage 10 digital output. The generated residue voltage $V_{RES}$ is coupled to the residue amplifier 40, where it is amplified by a pre-determined gain "G." The amplified residue is passed to the second stage 20, where N2 bits of the total M bits of the digital output $D_{out}$ are generated.

Figure 4:
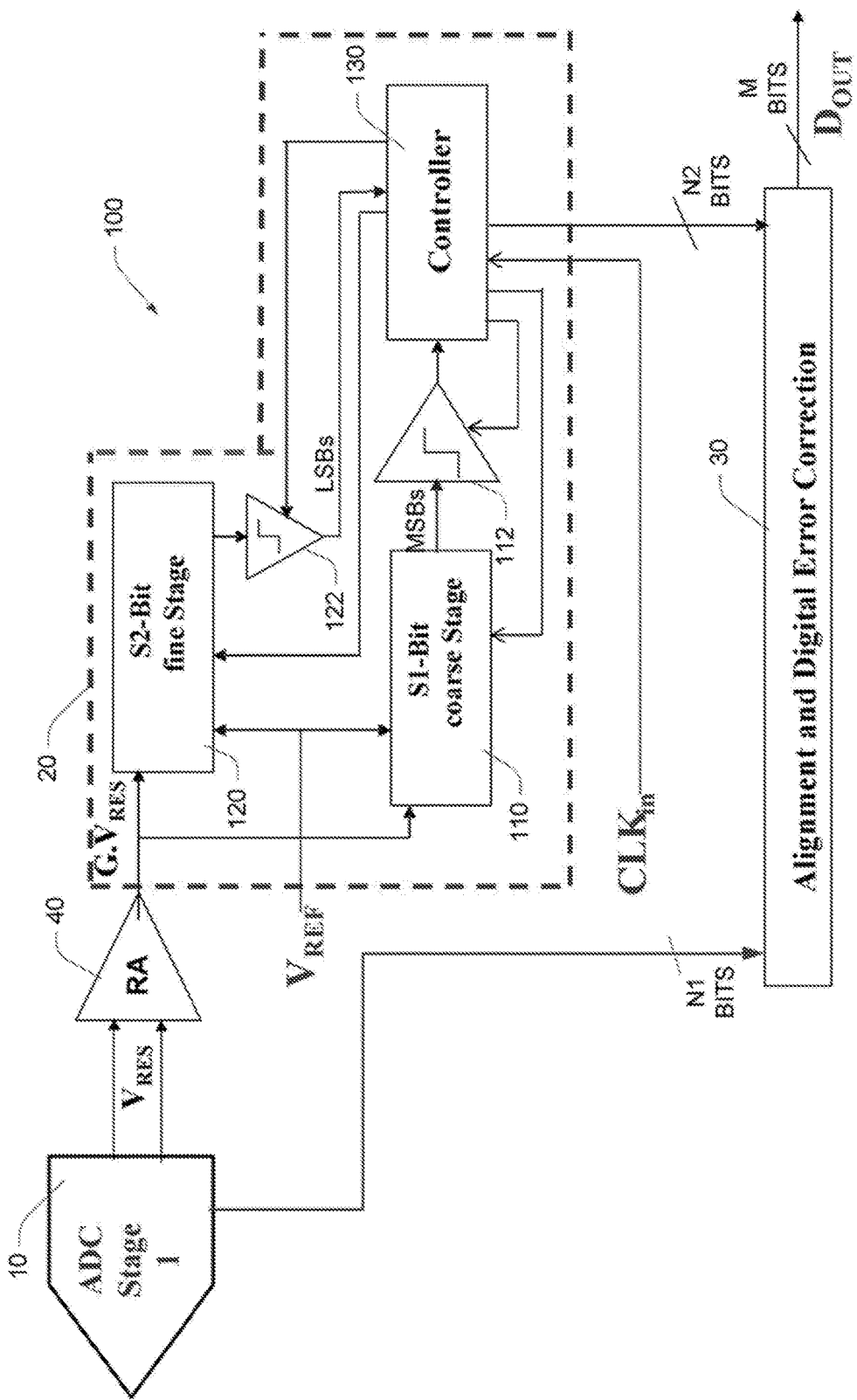
FIG. 4 is a circuit diagram illustrating further aspects of the ADC system illustrated in FIGS. 1 and 2.

As noted herein, in some examples the second ADC stage 20 includes the same configuration as the first ADC stage 10. FIG. 4 illustrates an example of further aspects of the second ADC stage 20. In the example of FIG. 4, the second ADC stage 20 is a second subranging SAR sub-ADC. The second ADC stage 20 outputs N2 bits of the total digital output M bits based on the received residue signal $V_{RES}$, which represents the difference between the analog input voltage signal $V_{IP}$ and the digital value output by the first ADC stage 10.

The asynchronous SAR digital controller 130 receives the clock signal $CLK_{in}$, and is configured to asynchronously control operations of the second ADC stage 20 as shown in FIG. 4. The coarse and fine stages 110, 120 of the second ADC stage 20 include respective fine and coarse comparators 112, 122, which function to successively narrow the received reference voltage range $V_{REF}$.

The coarse comparator 112 of the coarse stage 110 performs the MSB conversion of the second ADC stage 20, and the resulting MSBs are received by the controller 130, which initiates the LSBs conversion by the fine comparator 122 of the fine stage 120. The resulting LSBs are then coupled to the controller 130, which combines the received MSBs and LSBs to output the N2 bits of the second stage 20 to the alignment and digital error correction circuit implemented by the ADC controller 30.

The accuracy requirements of the course stage 110 are much less than the accuracy of the overall first and second ADC stages 10,20, thereby reducing the overall power consumption. Only the accuracy of the fine stage 120 needs to be commensurate with the overall accuracy of the ADC system 100. Since the course stage 110 only converts the MSBs of the digital value representing the received analog signal ($V_{IP}$ or $V_{RES}$), the coarse stage ADC 110 only needs to be accurate to S1 bits. While the coarse stage 110 is converting the analog signal to the S1 bits of the digital value, the second stage 120 can be idle, which conserves power.

In addition, the conversion rate of disclosed ADC system 100 is improved by the pipelined operation, which serves to mitigate the effects of the serial operation of traditional SAR ADCs.

Figure 5:
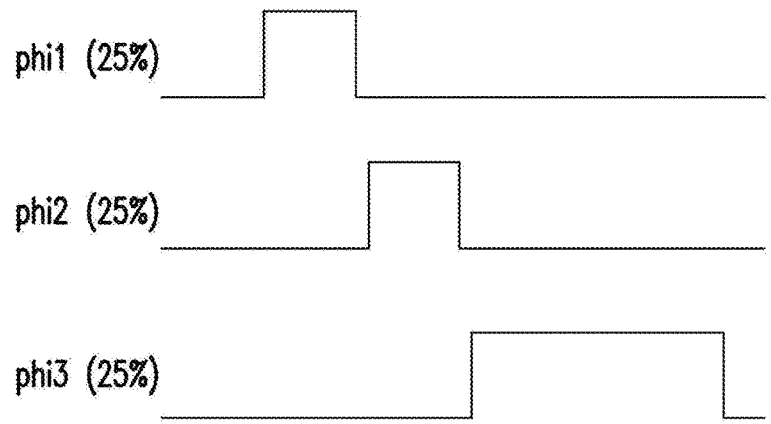
FIG. 5 is a timing diagram illustrating example timing signals for various ADC operation phases in accordance with some embodiments.

FIG. 5 illustrates an example timing diagram for the first ADC stage 10 and/or the second ADC stage 20. The timing diagram shown in FIG. 5 illustrates time signals for a first operation phase phi1, a second operation phase phi2 and a third operation phase phi3 of the ADC system 100. When the phi1 pulse is high, the first ADC stage 10 tracks and acquires the analog input signal $V_{IP}$. At the same time, the residue amplifier 40 is disabled. Also, when the phi1 pulse is high, the second ADC stage 20 performs analog to digital conversion of the previously sampled signal.

When the phi2 pulse is high, the first ADC stage 10 is performing analog to digital conversion of the analog signals previously acquired during the first phase phi1. At the same time, the residue amplifier 40 can be in an auto-zero mode, which is a circuit technique used to cancel the input offset of an amplifier such as the residue amplifier 40. Also, when the phi2 signal is high, the second ADC stage is also performing analog to digital conversion.

When the phi3 pulse is high, the first ADC stage 10 holds the residue signal, which is the difference between the input signal $V_{IP}$ sampled during phi1 and the equivalent digital output of the first ADC stage 10. At the same time, the residue amplifier 40 amplifies the analog residue signal $V_{RES}$ by a pre-determined gain value G. Also, the second ADC stage 20 samples the amplified residue corresponding to a previously-generated residue signal.

Figure 6:
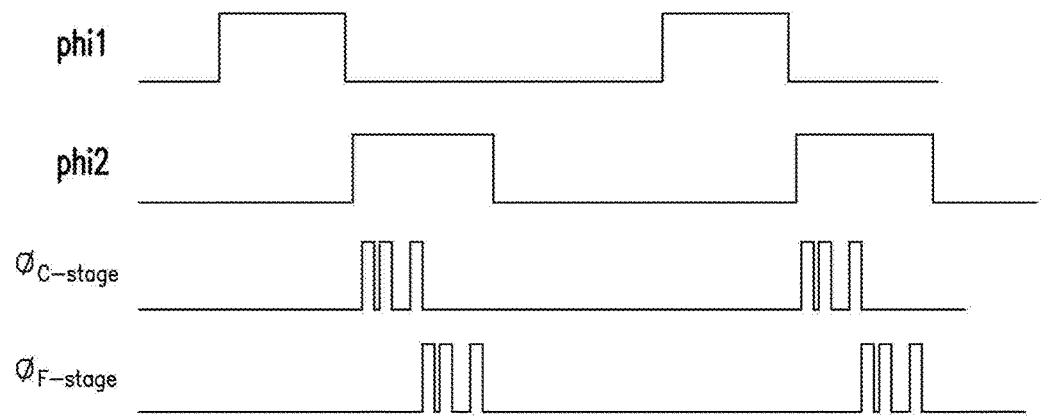
FIG. 6 is a timing diagram illustrating further example timing signals for ADC operation phases in accordance with some embodiments.

FIG. 6 is another timing diagram showing the phi1 signal (track and hold), and $\phi_{c\text{-}stage}$ and $\phi_{F\text{-}stage}$ pulses, which are derived from the phi2 signal. The $\phi_{c\text{-}stage}$ and $\phi_{F\text{-}stage}$ pulses indicate the coarse stage 110 and fine stage 120 successive approximation cycling of the SAR ADCs, respectively. As shown in FIG. 6, the fine stage SAR cycling (generating the S2/S4 bits) begins following the course stage SAR cycling (generating the S1/S3 bits).

Figure 7:
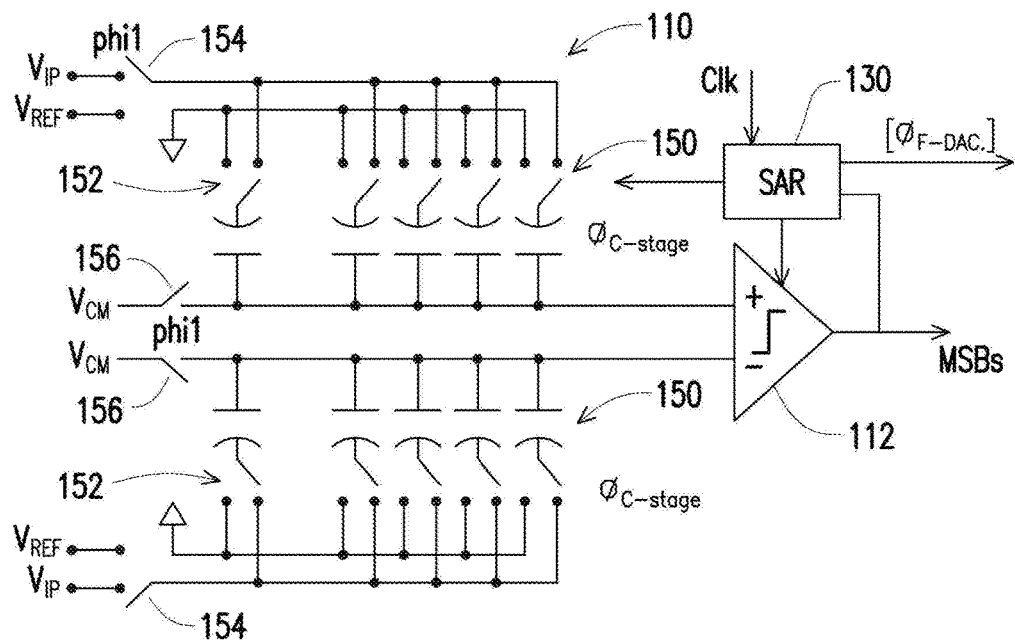
FIG. 7 is a circuit diagram illustrating aspects of an example coarse stage ADC in accordance with some embodiments.

FIG. 7 illustrates further details of an example of the course stage 110. Referring to FIG. 7 and the timing diagram of FIG. 6, the course stage 110 includes a plurality of capacitors 150. Switches 152 selectively connect one side of the capacitors 150 to the analog input voltage signal $V_{IP}$ or the $V_{REF}$ signal (based on switches 154), or ground. The other side of the capacitors 150 are selectively connected to a common mode voltage signal $V_{CM}$ based on switches 156. The switches 154 and 156 operate in response to the phi1 signal, and the switches 152 operate in response to the $\phi_{c\text{-}stage}$ pulses.

When the phi1 signal is high, the analog input signal $V_{IP}$ is acquired on the top plates of the capacitors 150. At the same time, the bottom plates of the capacitors 150 and the inputs of the course comparator 114 are coupled to the common mode voltage $V_{CM}$.

During the next phase, the $\phi_{c\text{-}stage}$ pulses are asserted to control the SAR binary search algorithm, implemented by the SAR controller 130, and generate the course stage 10 digital output bits. As noted above, the $\phi_{c\text{-}stage}$ pulses are derived from the phi2 signals. Thus, the $\phi_{c\text{-}stage}$ pulses that function to generate the course stage 10 digital output bits are generated while phi1 is low. In other words, the course stage 10 is disabled (or powered down) after generating the MSBs of the respective first or second ADC stage 10, 20, thereby reducing power consumption.

Figure 8:
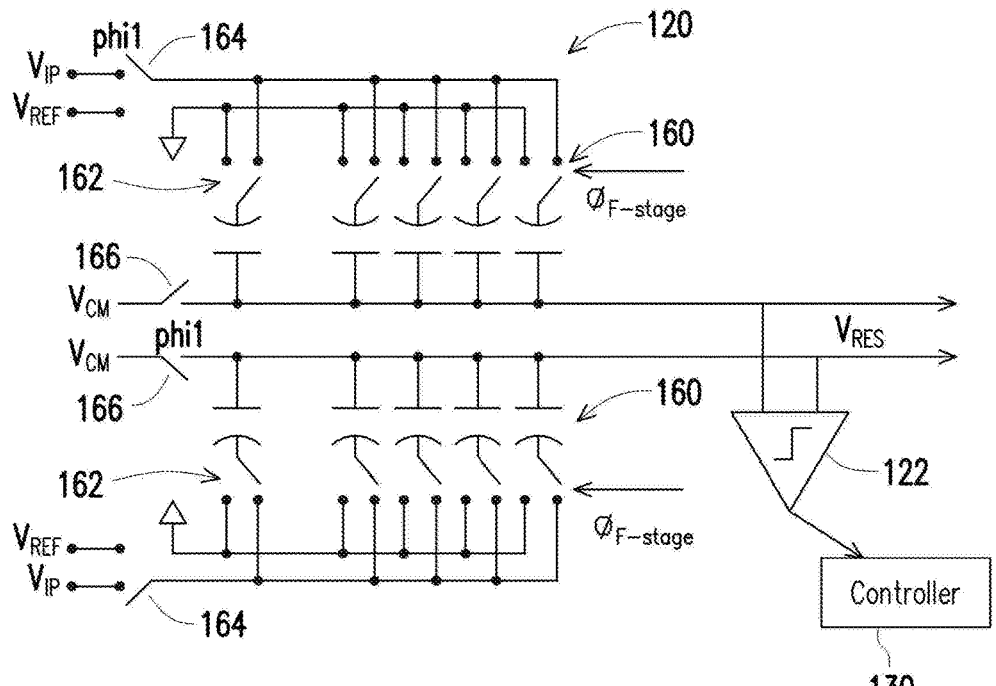
FIG. 8 is a circuit diagram illustrating aspects of an example fine stage ADC in accordance with some embodiments.

FIG. 8 illustrates further details of an example of the fine stage 120. The course stage 110 includes a plurality of capacitors 160. Switches 162 selectively connect one side of the capacitors 160 to the analog input voltage signal $V_{IP}$ or the $V_{REF}$ signal (based on switches 164), or ground. The other side of the capacitors 160 are selectively connected to the common mode voltage signal $V_{CM}$ based on switches 166. The switches 164 and 166 operate in response to the phi1 signal, and the switches 166 operate in response to the $\phi_{F\text{-}stage}$ pulses shown in FIG. 6.

Thus, during phi1, the analog input voltage signal $V_{ip}$ is on the top plates of the capacitors 160. At the same time, the bottom plates of the capacitors 160 and the inputs of the fine comparator 122 are coupled to the common mode voltage $V_{cm}$.

During the next phase, the $\phi_{F\text{-}stage}$ pulses are asserted (after the $\phi_{c\text{-}stage}$ pulses) to control the SAR binary search algorithm and generate the fine stage digital bits S2. The $\phi_{F\text{-}stage}$ is active only for a portion of the time while phi1 is low. In other words, the fine stage 120 is disabled (or powered down) when the course stage 110 is generating the MSBs of the respective first or second stage 10, 20, which helps to reduce power consumption.

Figure 9:
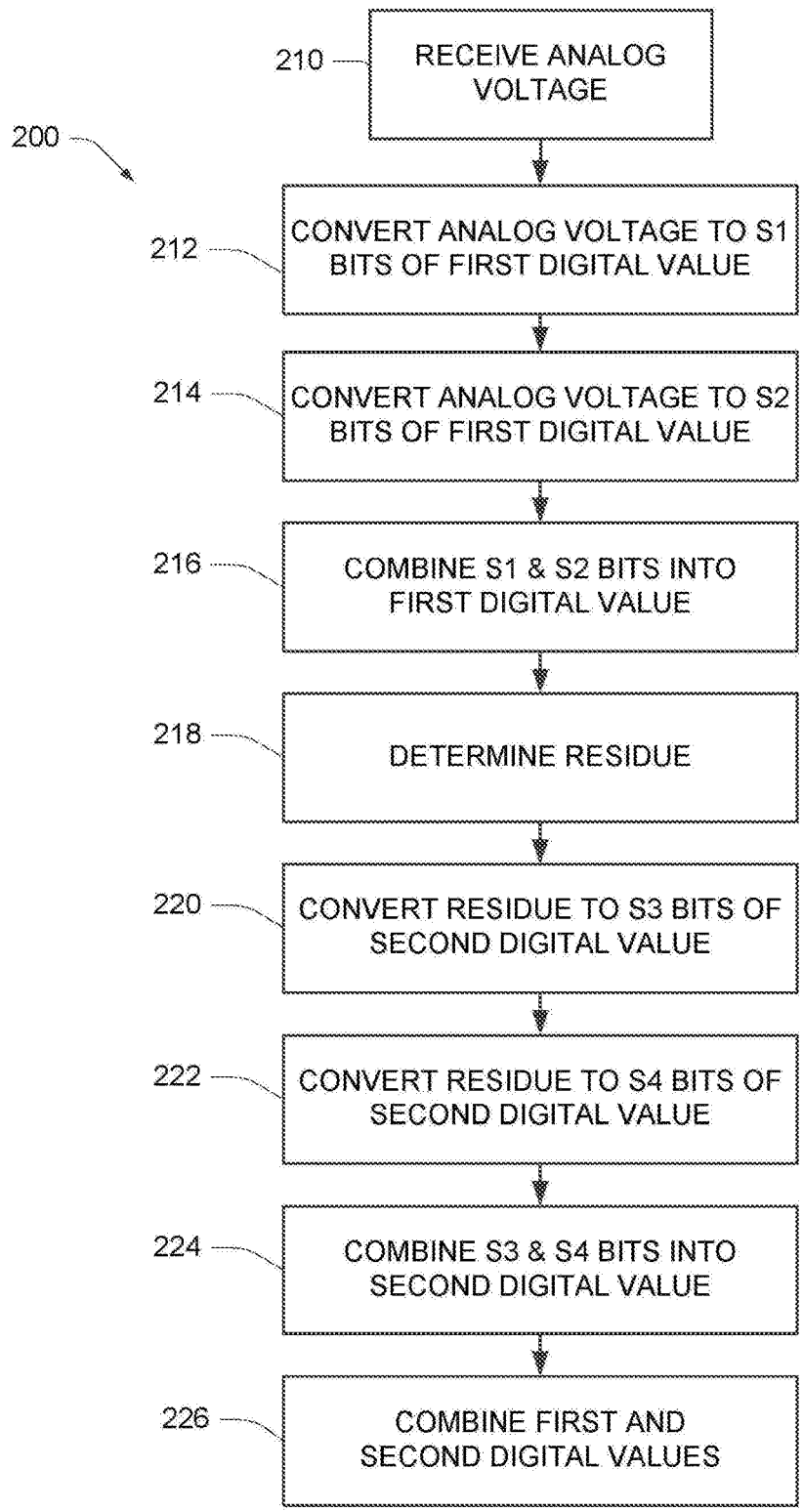
FIG. 9 a process flow diagram illustrating an example of an ADC method in accordance with some embodiments

FIG. 9 is a flow diagram illustrating an example ADC method 200 in accordance with some embodiments. The illustrated method 200 includes receiving an analog input voltage signal in block 210, such as the input signal $V_{IP}$ received via the input terminal 102 as shown in FIG. 1. In block 212, the analog input voltage signal is converted to a first number of bits S1 of a first digital value, and in block 214 the analog input voltage signal is converted to a second number of bits S2 of the first digital value based at least in part on the first number of bits of the first digital value. As discussed herein above, in some embodiments the S1 bits conversion is done by a course stage ADC and the S2 bits conversion is done by a fine stage ADS of a first stage subranging ADC. The fine stage receives the S1 bits output by the course stage, which may be the MSBs of the first subranging ADC stage. The S1 and S2 bits are combined into a first digital value in block 216, which represents a portion of a digital output signal corresponding to the analog input voltage signal.

An analog residue signal based on a difference between the first digital value and the analog input voltage signal is determined in block 218, and the analog residue signal is converted to a third number of bits S3 (MSBs) of a second digital value in block 220. The analog residue signal is converted to a fourth number of bits S4 (LSBs, S4>S3) of the second digital value based at least in part on the third number of bits of the second digital value in block 222, and the third number of bits S3 and the fourth number of bits S4 are combined into the second digital value in block 224. In block 226, the first digital value and the second digital value are combined into a digital output signal representing the analog input voltage signal.

Additionally, in some examples, a SAR ADC arrangement is employed, so converting the analog input voltage signal to the first number of bits of the first digital value in block 212 and converting the analog input voltage signal to the second number of bits of the first digital value in block 214 each include comparing the analog input voltage signal to a reference voltage range, and successively narrowing the reference voltage range in response to the comparison. Moreover, in some examples, the analog input voltage signal is converted to the first number of bits S1 of the first digital value by the coarse ADC stage 110, and the analog input voltage signal is converted to the second number of bits S2 of the first digital value by the fine ADC stage 120.

Disclosed embodiments include an ADC that includes an input terminal configured to receive an analog input voltage signal, and a first ADC stage coupled to the input terminal configured to output a first digital value corresponding to the analog input voltage signal. The first ADC stage further outputs an analog residue signal corresponding to a difference between the first digital value and the analog input signal. A second ADC stage is coupled to the first ADC stage and is configured to convert the analog residue signal to a second digital value. At least one of the first ADC stage and the second ADC stage has a first sub-stage configured to convert an analog signal to a first number of bits of a digital value representing the analog signal, and a second sub-stage configured to convert the analog signal to a second number of bits of the digital value, where the second number of bits is greater than the first number of bits. A controller is coupled to the first and second ADC stages and is configured to combine the first digital value and the second digital value into a digital output signal representing the analog input voltage signal.

In accordance with further disclosed embodiments, an ADC includes an input terminal configured to receive an analog input voltage signal and an output terminal configured to output a first digital output signal representing the analog input voltage signal. A controller is configured to receive a clock signal, and the controller is configured to establish first and second operation phases in response to the clock signal. A first ADC stage includes a coarse stage coupled to the input terminal and a fine stage coupled to the input terminal. The fine stage receives an output of the coarse stage. The controller is configured to operate the coarse stage to sample the analog input voltage signal during the first operation phase, operate the fine stage to sample the analog input voltage signal during the first operation phase, operate the coarse stage to convert the analog input voltage signal to a first number of bits of the first digital output signal during the second operation phase, operate the fine stage to convert the analog signal to a second number of bits of the first digital output signal during the second operation phase, and combine the first number of bits and the second number of bits.

In accordance with still further disclosed embodiments, an ADC method includes receiving an analog input voltage signal. The analog input voltage signal is converted to a first number of bits of a first digital value, and the analog input voltage signal is converted to a second number of bits of the first digital value based at least in part on the first number of bits of the first digital value. The first number of bits and the second number of bits are combined into the first digital value. An analog residue signal is determined based on a difference between the first digital value and the analog input voltage signal. The analog residue signal is converted to a third number of bits of a second digital value, and the analog residue signal is converted to a fourth number of bits of the second digital value based at least in part on the third number of bits of the second digital value. The third number of bits and the fourth number of bits are combined into the second digital value, and the first digital value and the second digital value are into a digital output signal representing the analog input voltage signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter ("ADC"), comprising:
   an input terminal configured to receive an analog input voltage signal;
   a first ADC stage coupled to the input terminal and configured to output a first digital value corresponding to the analog input voltage signal and an analog residue signal corresponding to a difference between the first digital value and the analog input signal;
   the first ADC stage including a first sub-stage coupled to the input terminal and configured to convert the analog input signal to a first number of bits of the first digital value;
   the first ADC stage including a second sub-stage coupled to the input terminal and configured to convert the analog input signal to a second number of bits of the first digital value, the second sub-stage configured to output the analog residue signal;
   a second ADC stage coupled to the first ADC stage and configured to receive the analog residue signal from the second sub-stage and convert the analog residue signal to a second digital value; and
   a controller coupled to the first and second ADC stages and configured to combine the first digital value and the second digital value into a digital output signal representing the analog input voltage signal.

2. The ADC of claim 1, further comprising an amplifier receiving the analog residue signal output by the first ADC stage, wherein the amplifier is configured to apply a predetermined gain to the analog residue signal and output the amplified analog residue signal to the second ADC stage.

3. The ADC of claim 1, wherein the second ADC stage includes a third sub-stage and a fourth sub-stage, wherein the third sub-stage is configured to convert the analog residue signal to a third number of bits of the second digital value, and wherein the fourth sub-stage is configured to convert the analog residue signal to a fourth number of bits of the second digital value.

4. The ADC of claim 1, wherein the controller is configured to apply power to the first sub-stage during a first operation phase where the first sub-stage samples the analog input voltage signal, and wherein the controller is configured to remove power from the first sub-stage following the first operation phase.

5. The ADC of claim 4, wherein the controller is configured to apply power to the second sub-stage during a second operation phase where the first sub-phase generates the first number of bits and wherein the second sub-phase generates the second number of bits.

6. The ADC of claim 5, further comprising a clock signal generator configured to output a clock signal, wherein the controller establishes the first and second operation phases based on the clock signal.

7. The ADC of claim 4, further comprising an amplifier receiving the analog residue signal output by the first ADC stage, wherein the amplifier is configured to apply a predetermined gain to the analog residue signal and output the amplified analog residue signal to the second ADC stage, wherein the controller is configured disable the amplifier during the first operation stage phase.

8. An analog-to-digital converter ("ADC"), comprising:
   an input terminal configured to receive an analog input voltage signal;
   an output terminal configured to output a first digital output signal representing the analog input voltage signal;
   a controller configured to receive a clock signal, wherein the controller is configured to establish first and second operation phases in response to the clock signal;
   a first ADC stage including a coarse stage coupled to the input terminal and a fine stage coupled to the input terminal, the fine stage coupled to receive an output of the coarse stage;
   wherein the controller is configured to:
     operate the coarse stage to sample the analog input voltage signal during the first operation phase;
     operate the fine stage to sample the analog input voltage signal during the first operation phase;

operate the coarse stage to convert the analog input voltage signal to a first number of bits of the first digital output signal during the second operation phase;

operate the fine stage to convert the analog signal to a second number of bits of the first digital output signal during the second operation phase; and combine the first number of bits and the second number of bits.

9. The ADC of claim 8, wherein the second number of bits is greater than the first number of bits.

10. The ADC of claim 8, wherein the controller is configured to power down the coarse stage following the first operation phase.

11. The ADC of claim 8, wherein the second fine stage is further configured to output an analog residue signal corresponding to a difference between the digital output signal and the analog input signal.

12. The ADC of claim 11, further comprising an amplifier coupled to receive the analog residue signal.

13. The ADC of claim 12, further comprising a second ADC stage coupled to an output of the amplifier, wherein the second ADC stage is configured to convert the analog residue signal to a second digital output signal, and wherein the controller is configured to combine the first and second digital output signals.

14. The ADC of claim 13, wherein the second ADC stage includes a second coarse stage coupled to the output of the amplifier, and a second fine stage coupled to the output of the amplifier, the second fine stage coupled to receive an output of the second coarse stage.

15. An analog-to-digital conversion ("ADC") method, comprising:

receiving an analog input voltage signal via an input terminal;

converting the analog input voltage signal to a first number of bits of a first digital value by a coarse sub-stage of a first ADC stage connected to the input terminal;

converting the analog input voltage signal to a second number of bits of the first digital value based at least in part on the first number of bits of the first digital value by a fine sub-stage of the first ADC stage, the fine sub-stage connected to the input terminal;

combining the first number of bits and the second number of bits into the first digital value by a controller;

determining an analog residue signal based on a difference between the first digital value and the analog input voltage signal by the fine sub-stage of the first ADC stage;

converting the analog residue signal to a third number of bits of a second digital value by a coarse sub-stage of a second ADC stage that receives the analog residue signal from the first ADC stage;

converting the analog residue signal to a fourth number of bits of the second digital value based at least in part on the third number of bits of the second digital value by a fine sub-stage of the second ADC stage that receives the analog residue signal from the first ADC stage;

combining the third number of bits and the fourth number of bits into the second digital value by the controller; and combining the first digital value and the second digital value into a digital output signal representing the analog input voltage signal by the controller.

16. The method of claim 15, wherein converting the analog input voltage signal to the first number of bits of the first digital value, converting the analog input voltage signal to the second number of bits of the first digital value each include comparing the analog input voltage signal to a reference voltage range, and successively narrowing the reference voltage range in response to the comparison.

17. The method of claim 15, wherein the second number if bits is greater than the first number of bits.

18. The method of claim 17, wherein receiving the analog input voltage signal includes sampling the analog input voltage signal during a first operation stage, wherein the analog input voltage signal is converted to the first number of bits of the first digital value during a second operation phase, and wherein the coarse ADC stage is powered down during the second ADC stage.

* * * * *